US008125776B2

(12) United States Patent
Alexander et al.

(10) Patent No.: US 8,125,776 B2

(45) Date of Patent: Feb. 28, 2012

(54) SOCKET AND HEAT SINK UNIT FOR USE WITH REMOVABLE LED LIGHT MODULE

(75) Inventors: Clayton Alexander, Westlake Village, CA (US); Robert Rippey, III, Westlake Village, CA (US); Brandon Mundell, Thousand Oaks, CA (US)

(73) Assignee: Journée Lighting, Inc., Westlake Village, CA (US)

( * ) Notice: Subject to any disclaimer, the term of this patent is extended or adjusted under 35 U.S.C. 154(b) by 135 days.

(21) Appl. No.: 12/711,175

(22) Filed: Feb. 23, 2010

(65) Prior Publication Data

US 2011/0207366 A1 Aug. 25, 2011

(51) Int. Cl.
*H05K 7/20* (2006.01)

(52) U.S. Cl. ........ 361/688; 361/674; 361/710; 361/732; 362/294; 362/373

(58) Field of Classification Search .................. 361/674, 361/676, 677, 688, 689, 690, 692, 703, 710, 361/715, 717, 732, 733
See application file for complete search history.

(56) References Cited

U.S. PATENT DOCUMENTS 2,430,472 A 11/1947 Levy
(Continued)

FOREIGN PATENT DOCUMENTS

JP D1307268 8/2007
(Continued)

OTHER PUBLICATIONS

U.S. Appl. No. 29/353,914, filed Jan. 15, 2010, Alexander, et al.
(Continued)

*Primary Examiner* — Courtney Smith
(74) *Attorney, Agent, or Firm* — Knobbe Martens Olson & Bear, LLP

(57) ABSTRACT

A socket and heat sink unit includes a socket portion configured to releasably couple to a removable LED light module. The unit also includes a heat sink portion attached to the socket portion and extending about a central axis. The heat sink portion comprises a plurality of fins, as well as one or more apertures configured to receive fasteners therein to fix the unit to a light fixture housing. The socket and heat sink portions are monolithic.

12 Claims, 13 Drawing Sheets

U.S. PATENT DOCUMENTS

| | | | | |
|---|---|---|---|---|
| D149,124 | S | 3/1948 | Hewitt | |
| D152,113 | S | 12/1948 | Mehr | |
| D191,734 | S | 11/1961 | Daher et al. | |
| 3,435,891 | A * | 4/1969 | Parrish | 165/121 |
| D217,096 | S | 4/1970 | Birns | |
| 3,538,321 | A | 11/1970 | Keller et al. | |
| 3,639,751 | A | 2/1972 | Pichel | |
| 4,091,444 | A | 5/1978 | Mori | |
| D251,500 | S | 4/1979 | Aigner | |
| 4,453,203 | A | 6/1984 | Pate | |
| 4,761,721 | A | 8/1988 | Willing | |
| D322,862 | S | 12/1991 | Miller | |
| D340,514 | S | 10/1993 | Liao | |
| D383,236 | S | 9/1997 | Krogman | |
| D437,449 | S | 2/2001 | Soller | |
| D437,652 | S | 2/2001 | Uhler et al. | |
| D443,710 | S | 6/2001 | Chiu | |
| D446,592 | S | 8/2001 | Leen | |
| D448,508 | S | 9/2001 | Benghozi | |
| D452,843 | S | 1/2002 | Henrici | |
| D457,673 | S | 5/2002 | Martinson et al. | |
| D462,801 | S | 9/2002 | Huang | |
| D464,455 | S | 10/2002 | Fong et al. | |
| D465,046 | S | 10/2002 | Layne et al. | |
| D470,962 | S | 2/2003 | Chen | |
| D473,529 | S | 4/2003 | Feinbloom | |
| D476,439 | S | 6/2003 | O'Rourke | |
| D482,476 | S | 11/2003 | Kwong | |
| 6,691,768 | B2 | 2/2004 | Hsieh et al. | |
| D504,967 | S | 5/2005 | Kung | |
| 6,905,232 | B2 | 6/2005 | Lin | |
| D516,229 | S | 2/2006 | Tang | |
| 7,063,130 | B2 | 6/2006 | Huang | |
| D524,975 | S | 7/2006 | Oas | |
| D527,119 | S | 8/2006 | Maxik et al. | |
| 7,097,332 | B2 | 8/2006 | Vamberi | |
| 7,111,963 | B2 | 9/2006 | Zhang | |
| D530,683 | S | 10/2006 | Rivas et al. | |
| D541,957 | S | 5/2007 | Wang | |
| D544,110 | S | 6/2007 | Hooker et al. | |
| D545,457 | S | 6/2007 | Chen | |
| 7,303,301 | B2 | 12/2007 | Koren et al. | |
| D564,119 | S | 3/2008 | Metlen | |
| 7,358,657 | B2 | 4/2008 | Koelger et al. | |
| D568,829 | S | 5/2008 | Yamashita et al. | |
| 7,396,146 | B2 | 7/2008 | Wang | |
| D576,964 | S | 9/2008 | Shaner | |
| D577,453 | S | 9/2008 | Metlen | |
| D579,421 | S | 10/2008 | Chu | |
| D585,588 | S | 1/2009 | Alexander et al. | |
| D585,589 | S | 1/2009 | Alexander et al. | |
| D586,498 | S | 2/2009 | Wu et al. | |
| D591,894 | S | 5/2009 | Flank | |
| D592,799 | S | 5/2009 | Scott | |
| D597,246 | S | 7/2009 | Meyer et al. | |
| D597,247 | S | 7/2009 | Meyer et al. | |
| D602,868 | S | 10/2009 | Vogt et al. | |
| 7,607,802 | B2 * | 10/2009 | Kang et al. | 362/294 |
| 7,637,635 | B2 | 12/2009 | Xiao et al. | |
| D610,543 | S | 2/2010 | Coushaine | |
| 7,744,259 | B2 | 6/2010 | Walczak et al. | |
| 7,748,870 | B2 * | 7/2010 | Chang et al. | 362/294 |
| D626,094 | S | 10/2010 | Alexander et al. | |
| 7,813,111 | B2 * | 10/2010 | Anderson et al. | 361/674 |
| D627,507 | S | 11/2010 | Lai et al. | |
| D627,727 | S | 11/2010 | Alexander et al. | |
| D628,156 | S | 11/2010 | Alexander et al. | |
| 7,845,393 | B2 | 12/2010 | Kao et al. | |
| 7,866,850 | B2 | 1/2011 | Alexander et al. | |
| D633,248 | S | 2/2011 | Alexander et al. | |
| D645,007 | S | 9/2011 | Alexander | |
| 2002/0046826 | A1 | 4/2002 | Kao | |
| 2002/0067613 | A1 | 6/2002 | Grove | |
| 2003/0209963 | A1 | 11/2003 | Altgilbers et al. | |
| 2005/0083698 | A1 * | 4/2005 | Zampini et al. | 362/294 |
| 2005/0174780 | A1 | 8/2005 | Park | |
| 2005/0269060 | A1 | 12/2005 | Ku et al. | |
| 2006/0039156 | A1 | 2/2006 | Chen | |
| 2007/0253201 | A1 * | 11/2007 | Blincoe et al. | 362/294 |
| 2007/0253202 | A1 * | 11/2007 | Wu et al. | 362/294 |
| 2007/0275576 | A1 | 11/2007 | Yang | |
| 2007/0279921 | A1 * | 12/2007 | Alexander et al. | 362/368 |
| 2007/0297177 | A1 | 12/2007 | Wang et al. | |
| 2008/0080190 | A1 | 4/2008 | Walczak et al. | |
| 2008/0106907 | A1 | 5/2008 | Trott et al. | |
| 2008/0142194 | A1 | 6/2008 | Zhou et al. | |
| 2008/0158887 | A1 | 7/2008 | Zhu et al. | |
| 2009/0034283 | A1 | 2/2009 | Albright et al. | |
| 2009/0046464 | A1 | 2/2009 | Liu et al. | |
| 2009/0141500 | A1 * | 6/2009 | Peng | 362/294 |
| 2010/0026158 | A1 | 2/2010 | Wu | |
| 2010/0027258 | A1 | 2/2010 | Maxik et al. | |
| 2010/0091487 | A1 | 4/2010 | Shin | |
| 2010/0091497 | A1 | 4/2010 | Chen et al. | |
| 2010/0102696 | A1 | 4/2010 | Sun | |
| 2010/0127637 | A1 * | 5/2010 | Alexander et al. | 315/294 |
| 2010/0128484 | A1 | 5/2010 | Peng | |
| 2010/0149818 | A1 | 6/2010 | Ruffin | |
| 2011/0063849 | A1 * | 3/2011 | Alexander et al. | 362/294 |

FOREIGN PATENT DOCUMENTS

| | | |
|---|---|---|
| JP | D1307434 | 8/2007 |
| WO | WO DM/57383 | 9/2001 |

OTHER PUBLICATIONS

U.S. Appl. No. 29/353,916, filed Jan. 15, 2010, Alexander, et al.

* cited by examiner

SOCKET AND HEAT SINK UNIT FOR USE WITH REMOVABLE LED LIGHT MODULE

BACKGROUND

1. Field

The present invention is directed to a socket and heat sink unit for an LED light fixture, and more particularly to a replaceable socket and heat sink unit for use with a removable LED light module.

2. Description of the Related Art

Light fixture assemblies such as lamps, ceiling lights, and track lights are important fixtures in many homes and places of business. Such assemblies are used not only to illuminate an area, but often also to serve as a part of the decor of the area. However, it is often difficult to combine both form and function into a light fixture assembly without compromising one or the other.

Traditional light fixture assemblies typically use incandescent bulbs. Incandescent bulbs, while inexpensive, are not energy efficient, and have a poor luminous efficiency. To address the shortcomings of incandescent bulbs, a move is being made to use more energy-efficient and longer lasting sources of illumination, such as fluorescent bulbs, high-intensity discharge (HID) bulbs, and light emitting diodes (LEDs). Fluorescent bulbs and HID bulbs require a ballast to regulate the flow of power through the bulb, and thus can be difficult to incorporate into a standard light fixture assembly. Accordingly, LEDs, formerly reserved for special applications, are increasingly being considered as a light source for more conventional light fixtures assemblies.

LEDs offer a number of advantages over incandescent, fluorescent, and HID bulbs. For example, LEDs produce more light per watt than incandescent bulbs, LEDs do not change their color of illumination when dimmed, and LEDs can be constructed inside solid cases to provide increased protection and durability. LEDs also have an extremely long life span when conservatively run, sometimes over 100,000 hours, which is twice as long as the best fluorescent and HID bulbs and twenty times longer than the best incandescent bulbs. Moreover, LEDs generally fail by a gradual dimming over time, rather than abruptly burning out, as do incandescent, fluorescent, and HID bulbs. LEDs are also desirable over fluorescent bulbs due to their decreased size and lack of need of a ballast, and can be mass produced to be very small and easily mounted onto printed circuit boards.

While LEDs have various advantages over incandescent, fluorescent, and HID bulbs, the widespread adoption of LEDs has been hindered by the challenge of how to properly manage and disperse the heat that LEDs emit. The performance of an LED often depends on the ambient temperature of the operating environment, such that operating an LED in an environment having a moderately high ambient temperature can result in overheating the LED, and premature failure of the LED. Moreover, operation of an LED for extended period of time at an intensity sufficient to fully illuminate an area may also cause an LED to overheat and prematurely fail.

Accordingly, high-output LEDs require direct thermal coupling to a heat sink device in order to achieve the advertised life expectancies from LED manufacturers. This often results in the creation of a light fixture assembly that is not upgradeable or replaceable within a given light fixture. For example, LEDs are traditionally permanently coupled to a heat-dissipating fixture housing, requiring the end-user to discard the entire assembly after the end of the LED's lifespan.

Accordingly, there is a need for a replaceable socket and heat sink unit that can couple to a removable LED light module and can be easily incorporated in a variety of light fixtures.

SUMMARY

In accordance with one embodiment, a socket and heat sink unit for use with a removable LED light module is provided. The unit includes a socket portion configured to releasably couple to a removable LED light module. The unit also includes a heat sink portion attached to the socket portion and extending about a central axis. The heat sink portion comprises a plurality of fins, as well as one or more apertures configured to receive fasteners therein to fix the unit to a light fixture housing. The socket and heat sink portions are monolithic.

In accordance with another embodiment, a socket and heat sink unit coupleable to a removable LED light module is provided. The unit includes a socket portion configured to releasably couple to a removable LED light module, the socket having one or more openings formed in a base thereof and one or more ramps aligned with said openings, said ramps configured to releasably couple to an LED light module. The unit also includes a heat sink portion attached to the socket portion and extending about a central axis, the heat sink portion comprising a plurality of fins defining channels or recesses aligned with said openings in the socket. The socket and heat sink portions are monolithic, and the unit can be formed in a die casting process comprising a die and cooperating slides, said slides positionable relative to the die to form the channels, openings and one or more edges of said ramps, the slides removable from the die when the die casting process is complete.

In accordance with yet another embodiment, a method of manufacturing a socket and heat sink unit is provided. The method includes the step of providing a die having one or more complementary halves, said die having a shape complementary to the socket and heat sink unit. The method also includes the step of positioning one or more slides in a desired position relative to the die. Further, the method includes injecting molten metal under pressure into the die to die cast the socket and heat sink unit, the socket portion having one or more openings formed in a base thereof and one or more ramps aligned with said openings, said ramps configured to releasably couple to an LED light module. The heat sink is attached to the socket portion and extending about a central axis, the heat sink portion comprising a plurality of fins defining channels aligned with said openings in the socket. The slides are positionable relative to the die to form the channels, openings and one or more edges of said ramps when the molten metal is injected into the die, the slides removable from the die when the die casting process is complete.

DETAILED DESCRIPTION OF THE PREFERRED EMBODIMENTS

FIGS. 1-8 depict one embodiment of a socket and heat sink unit 100 for use with a removable LED light module.

The unit 100 includes a holder or socket 10 at a proximal end and a heat sink 50 at a distal end thereof, where the socket 10 and heat sink 50 extend along a longitudinal central axis X. In a preferred embodiment, the unit 100 is monolithic, so that the socket 10 and heat sink 50 are portions of a single piece.

The socket 10 preferably includes a wall 12 that can define a periphery of the socket 10. In the illustrated embodiment, the wall 12 defines a continuous circumference of the socket 10. In another embodiment, the wall 12 can define the circumference of the socket 10 but be discontinuous.

Figure 3:
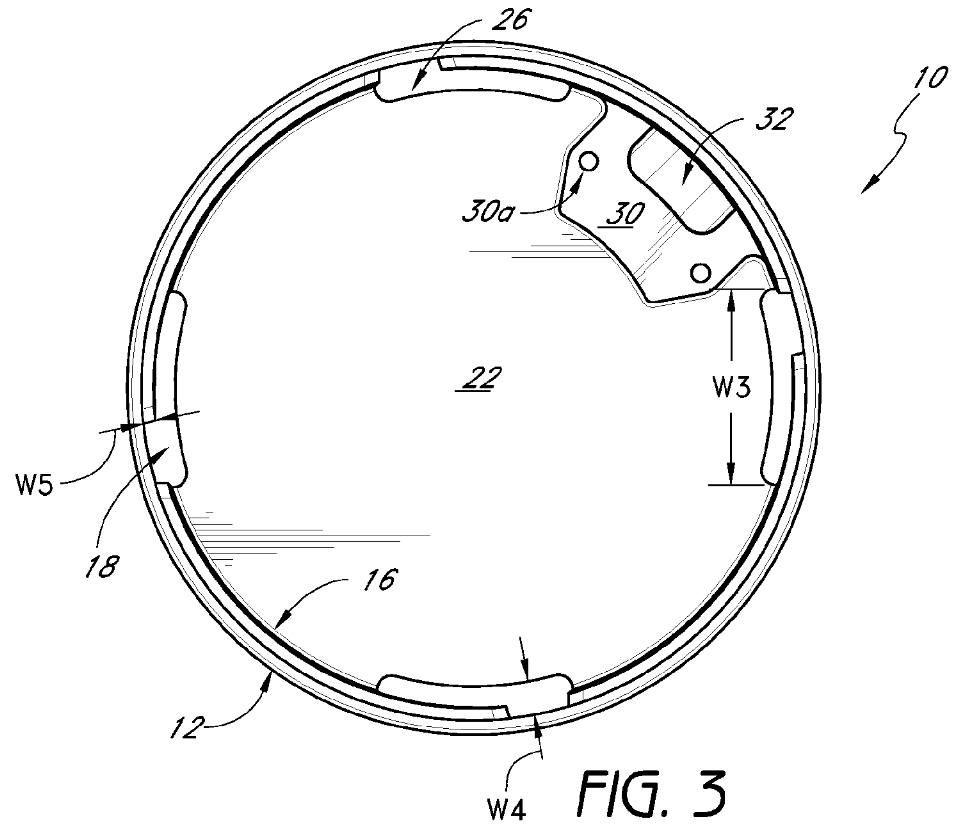
FIG. 3 is a top view of the socket and heat sink unit in FIG. 1.

The wall 12 can define an outer surface 14 and an inner surface 16. In one embodiment, the wall 16 can include one or more recessed portions 18 formed on one of the inner surface 16 and outer surface thereof. In the illustrated embodiment, the recessed portions 18 are formed on the inner surface 16 of the wall 12. As best shown in FIG. 3, the socket 10 has four recessed portions 18 on the inner surface 16 of the wall 12. However, the wall can have fewer or more recessed portions 18. Preferably, the number of recessed portions 18 (or locking ramps) corresponds to a number of coupling members (e.g., protrusions or tabs) on the removable LED light module that fix the LED light module relative to the socket 10. However, in another embodiment, the number of recesses 18 of the socket 10 can be different than the number of coupling members of the LED light module. Such coupling members may be formed on an outer surface of the LED light module housing (e.g., extend radially from an outer radial wall of said housing).

The recessed portion 18 can define an opening 18*a* proximate a rim 10*a* of the socket 10 that has a circumferential width W1 smaller than a circumferential width W2 of a generally horizontal portion 18*b* of the recessed portion 18. In another embodiment, the width W1 can be greater than the width W2. In use, each protrusion of the removable LED light module extends through the opening 18*a* of one of the recessed portions 18. A user can then rotate the removable LED light module relative to the socket 10 so that the coupling members of the light module move within the horizontal portion 18*b* and along an underside edge 20, which in one embodiment can be generally horizontal. The user can continue to rotate the LED light module until the coupling members contacts the stop portion 18*c* of the recessed portion 18 to thereby couple the LED light module to the socket 10. However, the LED light module can be removably coupled to the socket 10 via other suitable mechanisms (e.g., brackets, press-fit connection, threads, etc.).

The socket 10 can also include a base 22. In one embodiment, the base 22 and the wall 12 define a recessed cavity 24 into which at least a portion of the LED light module can extend. In another embodiment (not shown), the base of the socket is proximate the rim 10*a* of the socket 10, so that the base 22 and wall 12 do not define such a recessed cavity. As used herein, "socket" refers to a holder to which the removable LED light module couples and is not limited to any particular shape. In a preferred embodiment, a heat transfer surface of the removable LED light module is brought into contact with the socket 10 (e.g., the base 22 of the socket 10), when the light module is coupled to the socket 10, which facilitates the transfer of heat from the LED light module to the socket 10 and to the heat sink 50 attached to the socket 10.

In the illustrated embodiment, the base 22 has one or more openings 26 aligned with the recessed portions 18. Each opening can have a circumferential width W3 and a radial width W4. In the illustrated embodiment, the circumferential width W3 is substantially equal to the width W2 of the horizontal portion 18*b*, and the radial width W4 is greater than the radial width W5 of the recessed portion 18, as best shown in FIG. 3.

With continued reference to FIG. 3, the base 22 of the socket 10 can have a raised portion 30 to which a terminal block with one or more electrical contacts can be fastened. For example, the terminal block can be attached to the raised portion 30 with one or more fasteners (e.g., screws, bolts, pins) inserted through holes 30*a* in the raised portion 30. Advantageously, the terminal block can removably connect to an electrical contact on the removable LED light module when the light module is coupled to the socket 10. The raised portion 30 can include an aperture 32 formed through the base 22, as best shown in FIG. 3. The wall 12 can also include one or more apertures 34 formed therethrough. In one embodiment, an electrical cord for the terminal block can extend through the aperture 32 in the base 22. In another embodiment, the electrical cord for the terminal block can extend through the aperture 34 in the wall 12.

Figure 4:
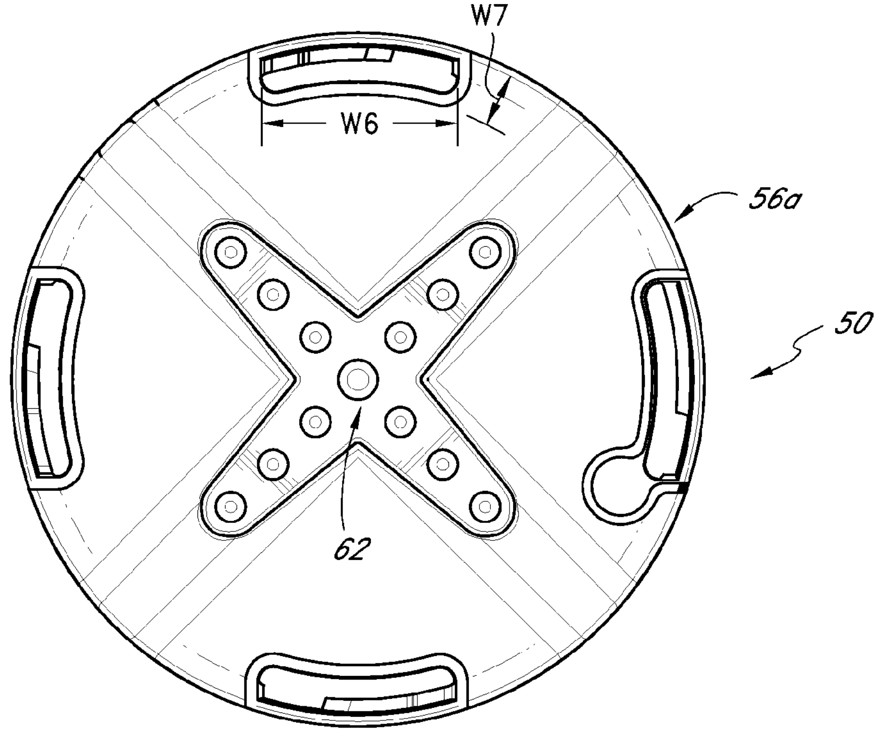
FIG. 4 is a bottom view of the socket and heat sink unit in FIG. 1.
Figure 5:
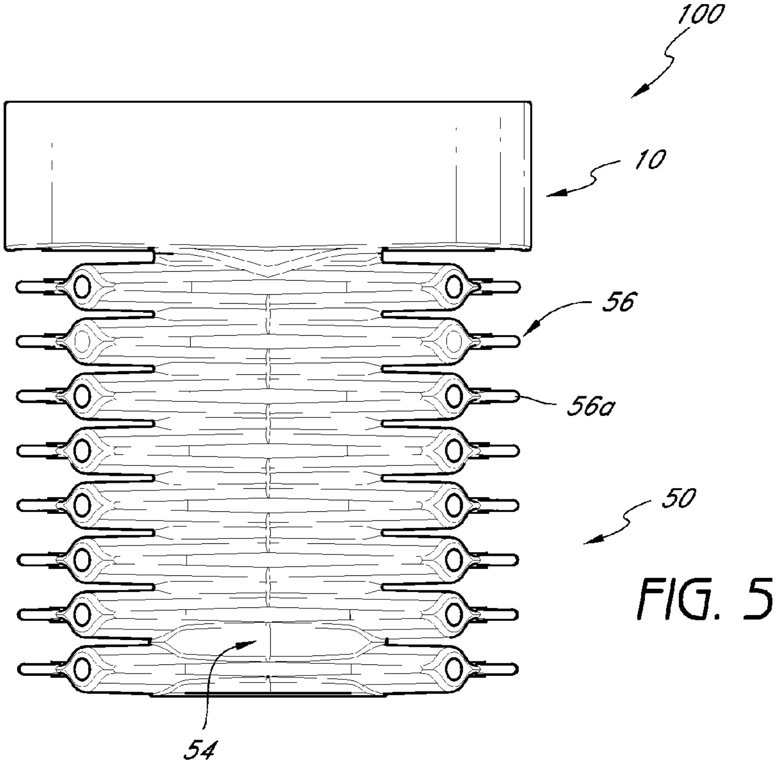
FIG. 5 is a side view of the socket and heat sink unit in FIG. 1.
Figure 6:
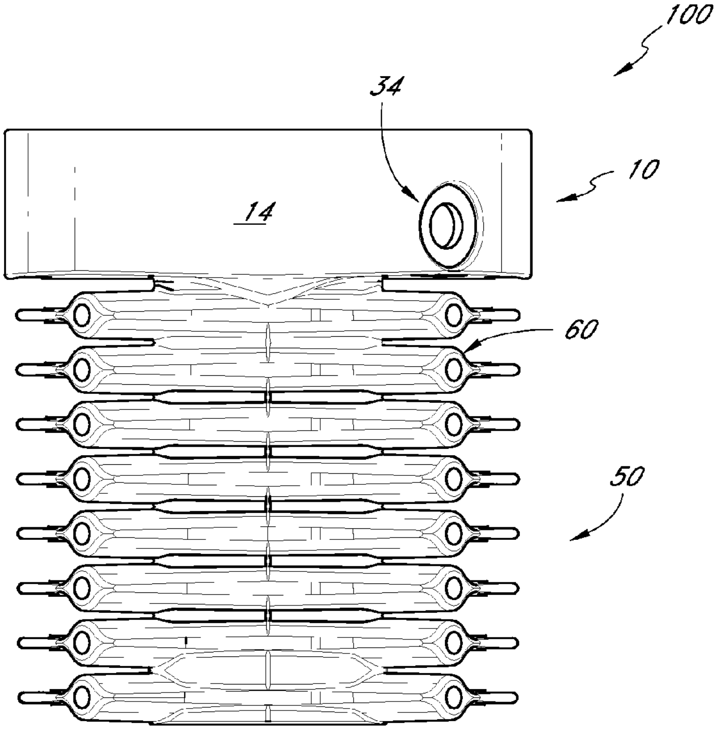
FIG. 6 is another side view of the socket and heat sink unit in FIG. 1, rotated 90 degrees from the view in FIG. 5.
Figure 7:
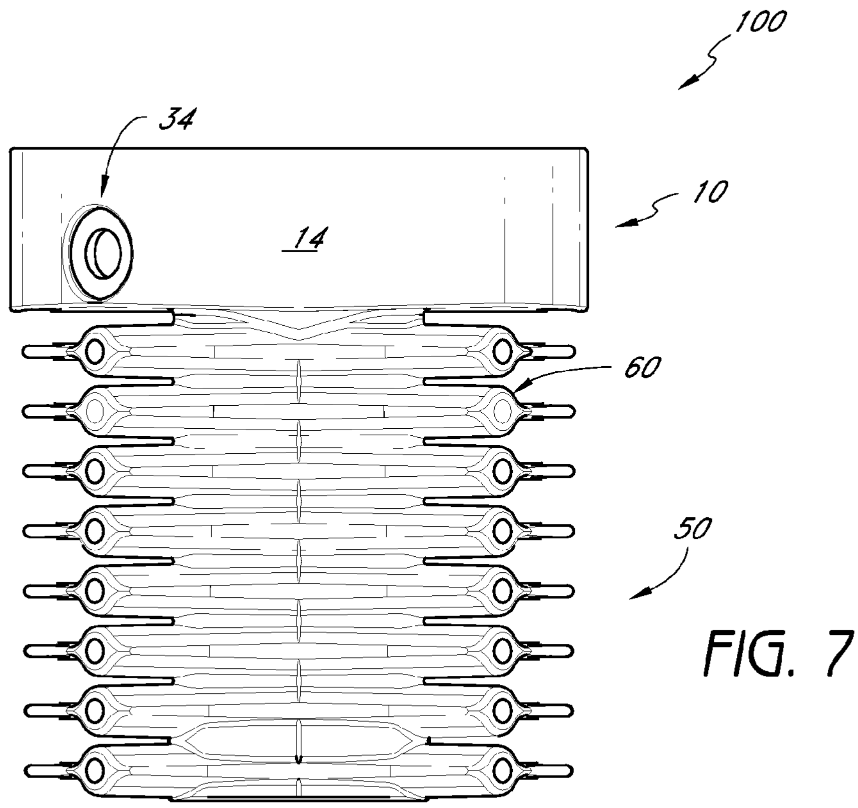
FIG. 7 is another side view of the socket and heat sink unit in FIG. 1, rotated 90 degrees from the view in FIG. 6.
Figure 8:
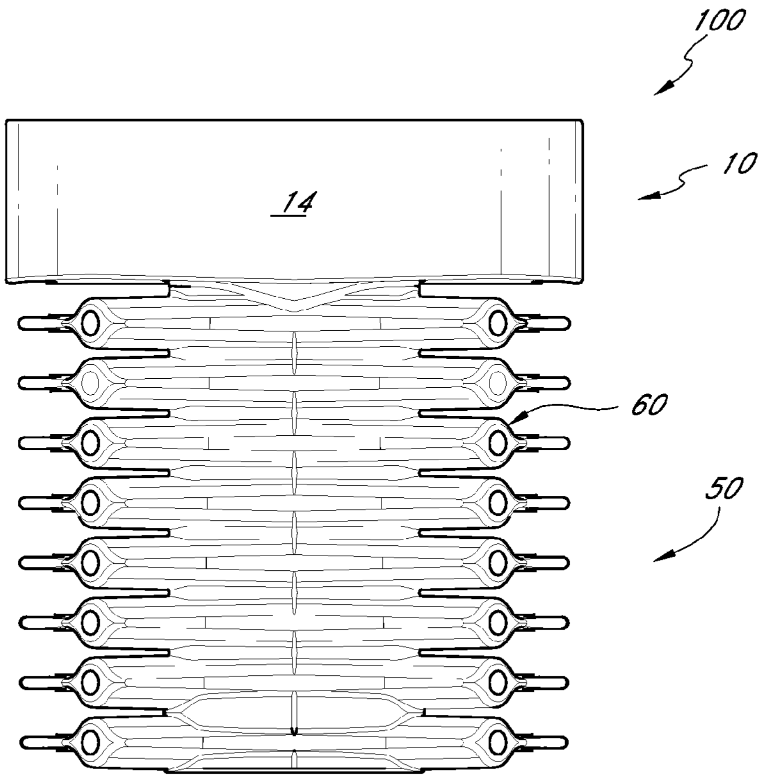
FIG. 8 is another side view of the socket and heat sink unit in FIG. 1, rotated 90 degrees from the view in FIG. 7.

With reference to FIGS. 2 and 5-8, the heat sink 50 can include a plurality of plate-like members 52 spaced axially apart from each other along the axis X so that the plate-like members 52 are stacked relative to each other. In one embodiment, the plate-like members 52 are all spaced apart from each other by the same amount. In another embodiment, at least two adjacent plate-like members 52 are closer to each other than to other adjacent plate-like members 52. The plate-like members 52 are attached to each other at a central portion 54 that extends along the axis X. In one embodiment, the central portion 54 is symmetric about the axis X. The plate like members 52 can also include a fin portion 56 that extends radially outward from the central portion 54. In a preferred embodiment, as illustrated in FIGS. 3-4, the plate-like members 52 are symmetric about the axis X and the fin portion 56 extends radially outward relative to the axis X to a boundary 56*a* so that the fin portion 56 has a maximum outer radius that is generally equal to a radius of the outer surface 14 of the socket 10. In another embodiment, the fin portion 56 has a maximum outer radius that is larger than the radius of the outer surface 14 of the socket 10.

Figure 1:
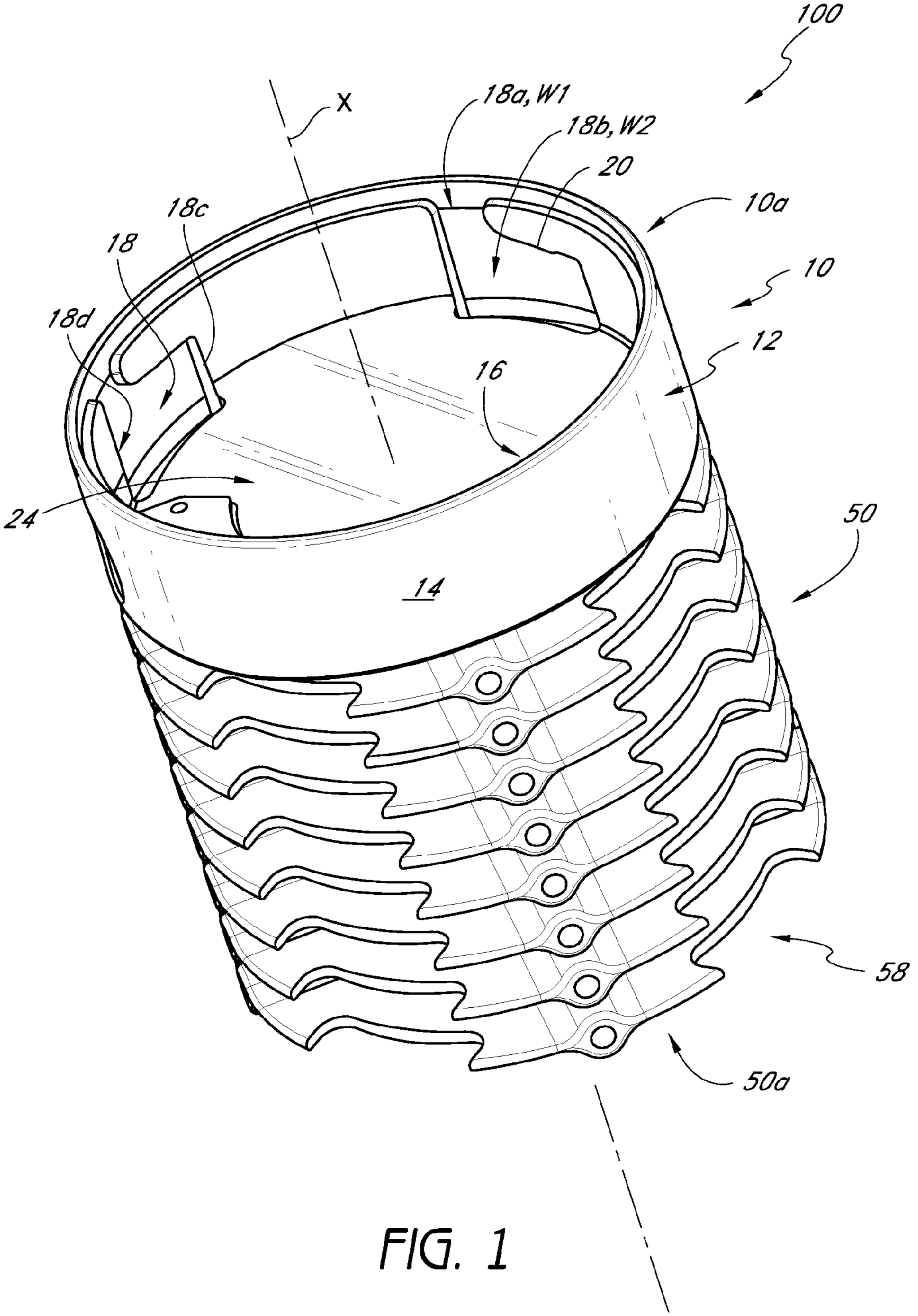
FIG. 1 is a perspective top view of one embodiment of a socket and heat sink unit.
Figure 2:
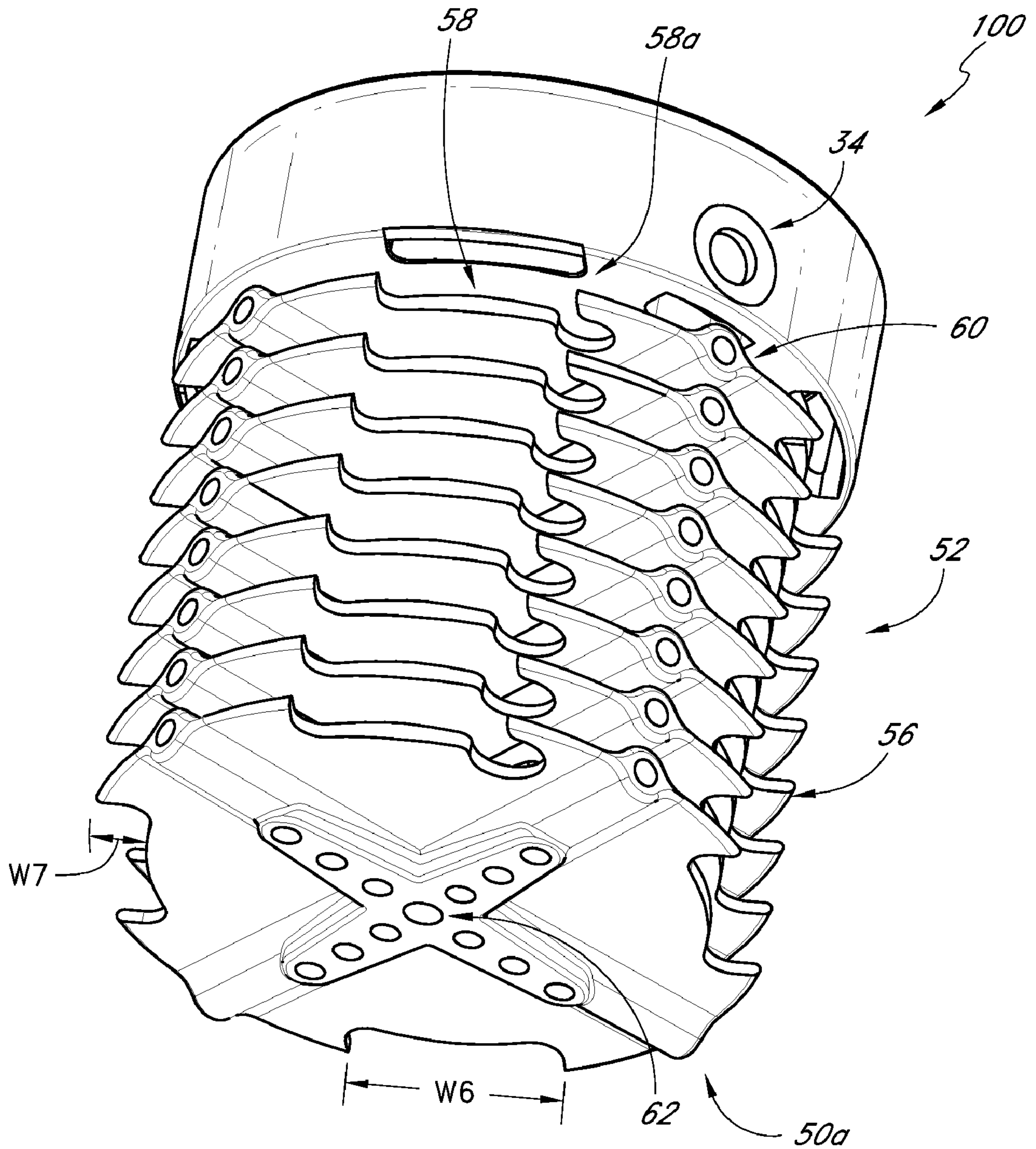
FIG. 2 is a perspective bottom view of the socket and heat sink unit in FIG. 1.

With reference to FIGS. 1, 2 and 5-8, the fin portion 56 of each plate-like member 52 can have one or more recesses 58 formed along the circumference of the plate-like member 52. Each recess 58 can extend radially inward from the boundary 56*a* of the fin portion 56. In another embodiment, the fin portion 56 has a maximum outer radius equal to the outer radius of the recess 58. In the illustrated embodiment, as best shown in FIGS. 2 and 4, the recesses 58 of the fin portions 56 on each plate-like member 52 generally axially align with each other. In one embodiment, each recess 58 has the same size as the corresponding opening 26 in the base 22 and the recesses 58 have generally the same shape. For example, in one embodiment, the circumferential and radial widths W6, W7 of the recesses 58 are generally equal to the radial and circumferential widths W3, W4 of the openings 26 in the base 22, respectively.

In another embodiment, as best shown in FIGS. 2 and 4, at least one of the recesses 58 in a fin portion 56 has a different shape than the other recesses 58 of the fin portion 56. As shown in FIG. 2, one or more of the recesses 58 of each plate-like member 52 can have a hook portion 58*a*, such that the hook portions 58*a* are axially aligned. In the illustrated embodiment, the hook portions 58*a* have a generally circular shape. However, in other embodiments the hook portion 58*a* can have other suitable shapes. Preferably, the hook portions 58*a* are sized to allow the passage of an electrical cord therethrough, which can pass through the aperture 32 in the base 22 and connect to the terminal block.

With continued reference to FIGS. 2 and 5-8, the fin portion 56 of each plate-like member 52 can have one or more bores 60 that extend radially inward from the boundary 56*a* toward the central portion 54. In the illustrated embodiment, each fin portion 56 has four bores 60, and the bores 60 on each plate-like member 52 generally align with the bores 60 on the other plate-like members 52. However, the fin portion 56 of the plate-like members 52 can have fewer or more bores than shown in FIG. 2. For example, in some embodiments, the fin portion 56 of each plate-like member 52 can have only one bore. In another embodiment, not all plate-like members 52 have bores formed on their fin portions 56. Additionally, the plate-like member 52 at a distal end 50*a* of the heat sink 50 can also have one or more bores 62 that extend generally axially or parallel to the X axis. Advantageously, the bores 60, 62 allow the socket and heat sink unit 100 to be fastened to, for example, a housing of a light assembly in a variety of orientations, therefore increasing the versatility of the socket and heat sink unit 100. Additionally, the plurality of bores 60, 62 allow the unit 100 to be easily replaced and/or repositioned as needed. For example, where the housing is a recessed can of a recessed lighting fixture, the socket and heat sink unit 100 can be fastened to the circumferential and/or rear walls of the recessed can via fasteners (e.g., screws) inserted through the bores 60, 62, respectively.

As noted above, the socket 10 and heat sink 50 of the unit 100 are preferably monolithic. For example, the unit 100 can be molded from a single piece. In a preferred embodiment, the unit 100 can be die cast using a single die-casting tool set 300 (see FIGS. 17-18D). In one embodiment, the tool set 300 can include two or more complementary sections 300A-300F that together form the die for the unit 100. The tool set 300 can also preferably include one or more slides 350 positionable relative to at least one of the sections 300A-300E of the die to define the recesses 58. Said slides 350 advantageously extend through strategically aligned slots 310 and past openings 312 in sections 300B-300E of the die, which correspond to the openings 26 in the socket 10. Additionally, a proximal portion 352 of the slide 350 can have a contour C that defines one or both of the horizontal edge 20 and the stop portion 18*c* of the recessed portion 18. Once the die casting process is complete, the slides 350 can be removed from the die, leaving the openings 26 and recesses 58 formed in the socket 10 and heat sink 50, respectively. Preferably, the slides 350 have an inner surface contour 354 that corresponds to the contour of the surface of the fin 56 and openings 26. For example, the slides 350 can have a curved contour that corresponds to the curved edge of the recesses 58 and curved edge of the openings 26. Other slides can be used to form the bores 60, 62 in the fin portions 56 and the bore 34 in the socket 10.

Figure 17:
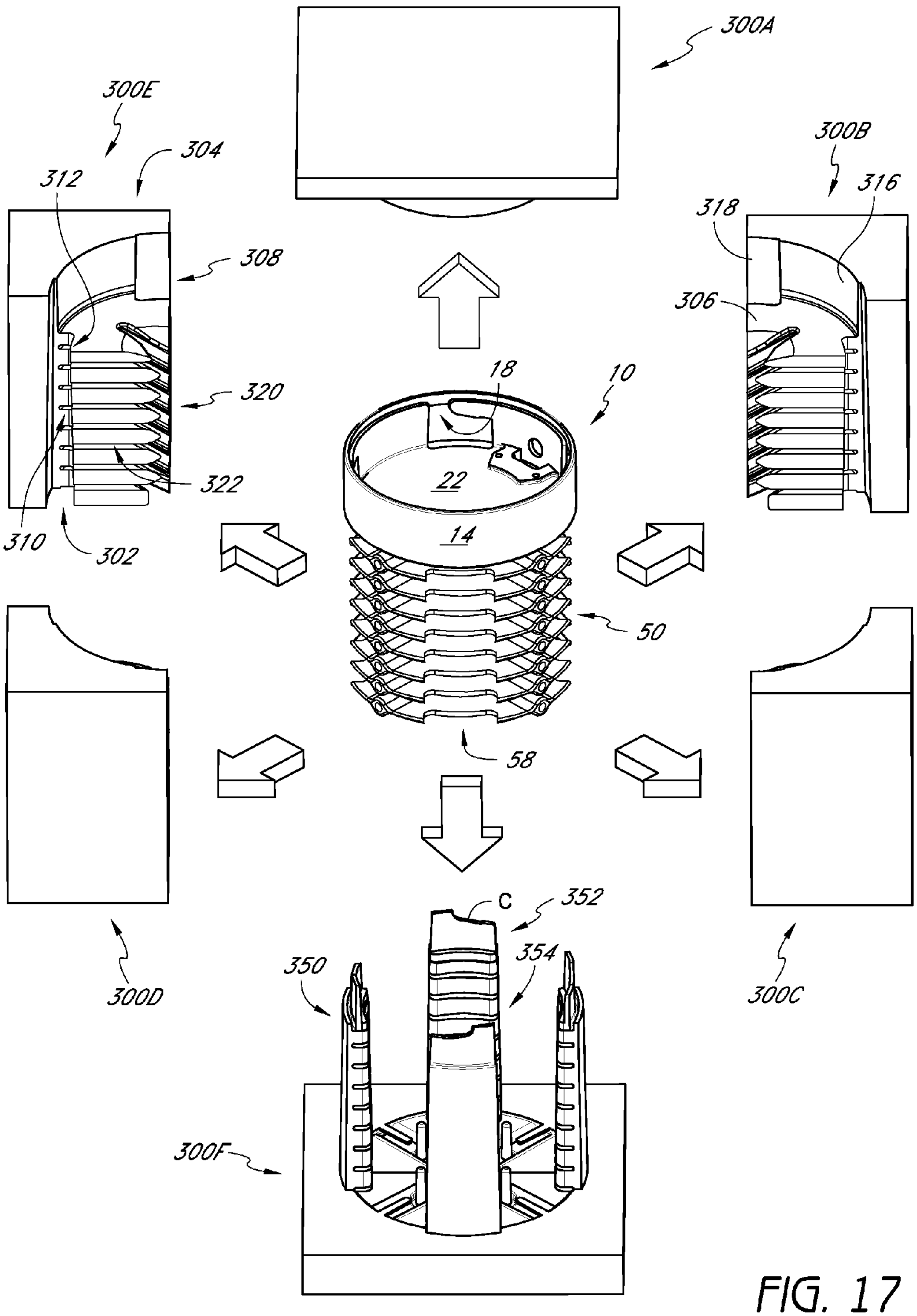
FIG. 17 is a perspective schematic view of the socket and heat sink unit of FIG. 1 and exploded view of one embodiment of a mold for forming the socket and heat sink unit.
Figure 18B:
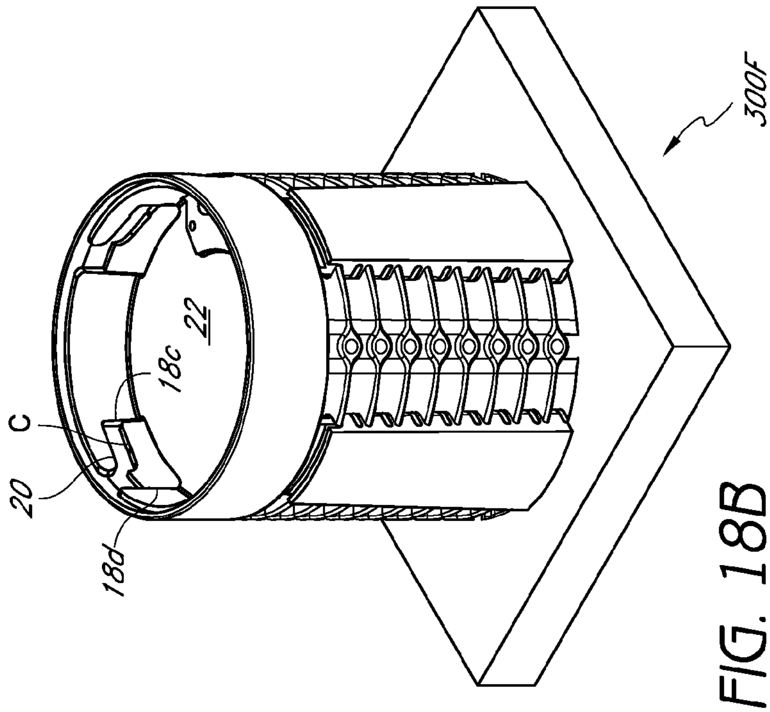
FIG. 18B is a perspective view of the socket and heat sink unit of FIG. 1. and a part of its corresponding mold during another step in the manufacturing process.
Figure 18A:
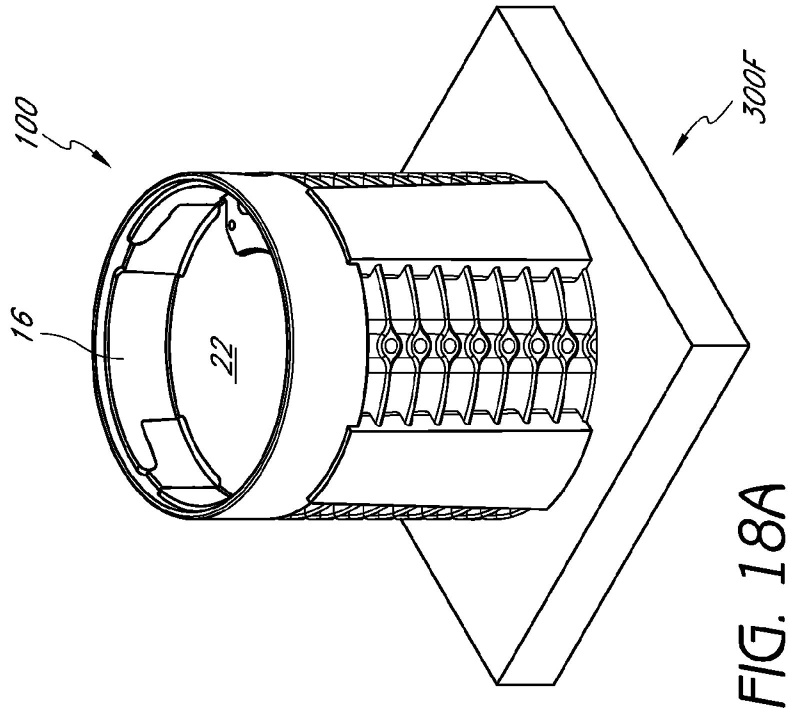
FIG. 18A is a perspective view of the socket and heat sink unit of FIG. 1. and a part of its corresponding mold during a step in the manufacturing process.
Figure 18D:
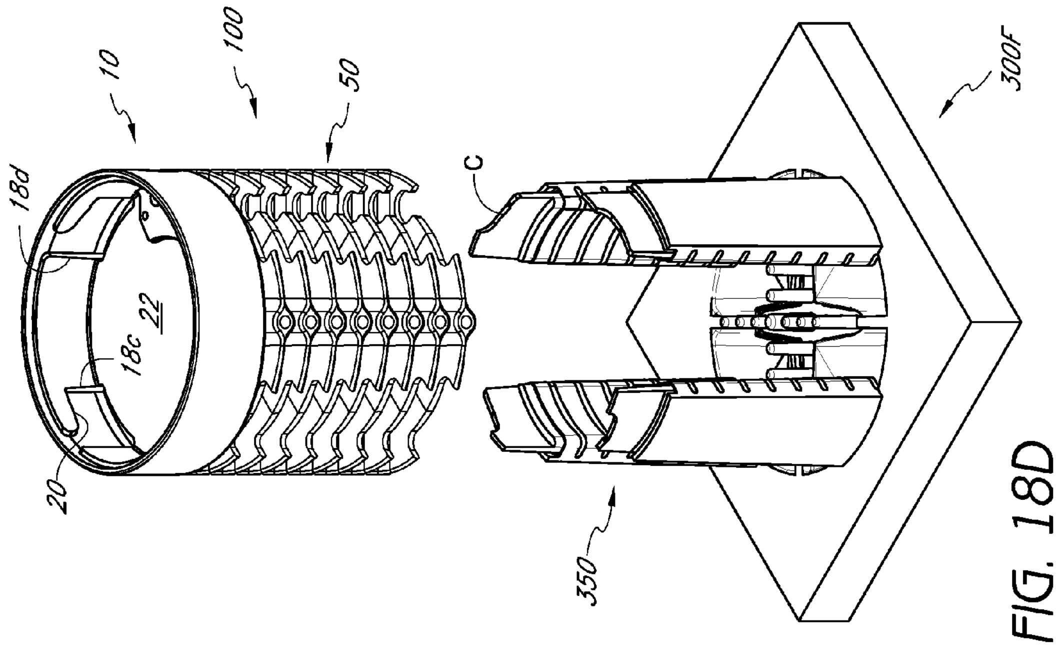
FIG. 18D is a perspective view of the socket and heat sink unit of FIG. 1. and a part of its corresponding mold during another step in the manufacturing process.
Figure 18C:
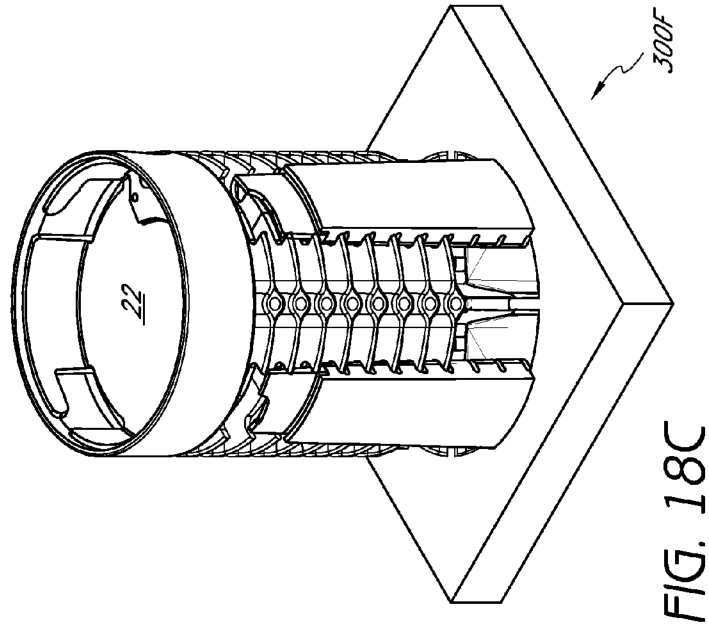
FIG. 18C is a perspective view of the socket and heat sink unit of FIG. 1. and a part of its corresponding mold during another step in the manufacturing process.

In the embodiment shown in FIGS. 17-18D, the tool set 300 includes a top section 300A, a plurality of side sections 300B-300E and a bottom section 300F. In use, the side sections 300B-300E can be placed adjacent each other so as to form a block. Advantageously, one or more of the side sections 300B-300E have one or more strategically aligned slots 310 that extend from the bottom 302 of the section 300B-300E to a location proximal the top 304 of the section 300B-300E. Preferably, the slot 310 defines an opening 312 in a base 306 of a top portion 308 of the section 300B-300E.

With continued reference to FIG. 17, in one embodiment each of the sections 300B-300E forms one quadrant of the socket and heat sink unit 100. However, in other embodiments the tool set 300 can have more or fewer sections. In the illustrated embodiment, the slots 310 define a surface 318 between the base 306 and the top 304 of the section 300B-300E. Additionally, at least one of the sections 300A-300E can have a generally circumferential surface 316 that extends between the surfaces 318 defined by the slots 310. At least a portion of the surfaces 316, 318 define a surface of the socket 10. The tool set 300 also includes a blade section 320 that defines a plurality of blades spaced apart by slots 322. Advantageously, the blade section 320 defines the heat sink section 50 of the socket and heat sink unit 100.

With reference to FIGS. 18A-18D, after the sections 300A-300F are assembled into the tool set 300 to form a die, molten metal is introduced into the die. Once the die casting process has been completed, the top section 300A and side sections 300B-300E can be removed, as shown in FIG. 18A. The bottom section 300F with the slides 350 can then be withdrawn, as shown in FIGS. 18A-18D. As can be seen as the bottom section 300F is withdrawn, the slides 350 have formed the recesses 58 in the heat sink section 50 of the unit 100. Additionally, the contour C of the proximal portion 352 of the slide 350 has advantageously formed one or more surface of the recessed portions 18 of the socket 10. In the illustrated embodiment, the contour C of the proximal portion 352 of the slide 350 has formed the underside edge 20 and a stop portion 18*c*, as well as a front edge 18*d* of the recessed portion 18. Accordingly, the tool set 300 can advantageously be used to manufacture a one piece socket and heat sink unit 100, including all features (e.g., recessed portions 18 or locking ramps)

needed to couple a removable LED light module to the socket 10 without additional machining.

Advantageously, said die-casting process allows the socket and heat sink unit 100 to be manufactured in an efficient and cost effective manner without requiring any additional machining, thus resulting in less cost and time for manufacturing the unit 100. Additionally, die-casting the unit 100 allows the socket 10 to also function as a heat dissipating member, with the wall 12 and base 22 of the socket 10 able to dissipate heat from the LED light module when said module is coupled to the socket 10.

In another embodiment, the unit 100 can be machined from a single piece using machining methods known in the art, with the recesses 58 and the openings 26 in the base 22 are formed generally at the same time. In still another embodiment, the unit 100 can be injection molded (e.g., where the unit 100 is made from a thermoplastic material).

Forming the socket 10 and heat sink 50 from a single piece advantageously reduces the cost of manufacture and the waste of material. For example, since all of the recesses 58 and openings 26 can be formed at the same time, the amount of time necessary for manufacturing the unit 100 is reduced. Additionally, the unit 100 has improved resiliency since the assembly of multiple pieces is avoided.

The unit 100 can be made from any suitable material configured to conduct heat in an amount suitable for the removal of heat from the removable LED light module. In one embodiment, the unit 100 can be made of metal. In another embodiment, the unit 100 can be made of a heat conductive plastic.

FIGS. 9-16 show another embodiment of a socket and heat sink unit 200. The unit 200 has some similar features as the unit 100, except as noted below. Thus, the reference numerals used to designate the various components of the unit 200 are identical to those used for identifying the corresponding components of the unit 100, except that a "2" has been added to the reference numerals.

In the illustrated embodiment, the unit 200 includes a holder or socket portion 210 and a heat sink portion 250 that extend (e.g., symmetrically) about a central axis X. The socket portion 210 has generally the same structure as the socket portion 10 described above and includes a wall 212 with an outer surface 214 and an inner surface 216, where one or more recess portions 218 can be formed on one of the inner and outer surfaces 214, 216. The recess portions 218 can be spaced circumferentially along the wall 212 (e.g., evenly spaced from each other), and can include an opening 218*a* proximate the rim 210*a* of the socket portion 210 and a horizontal portion 218*b* defined by a horizontal edge 220 and stop edge 218*c*.

Figure 9:
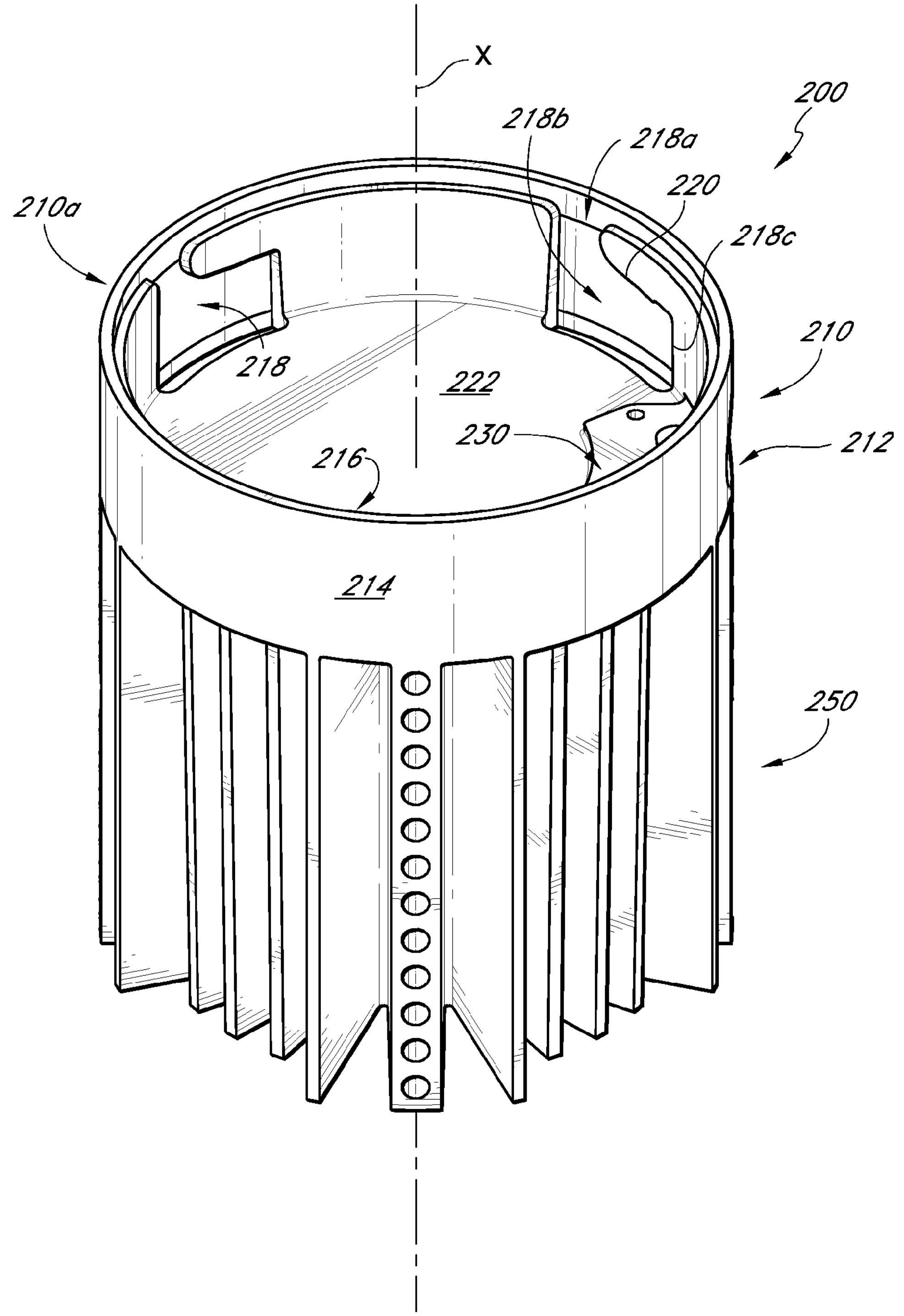
FIG. 9 is a perspective top view of another embodiment of a socket and heat sink unit.
Figure 10:
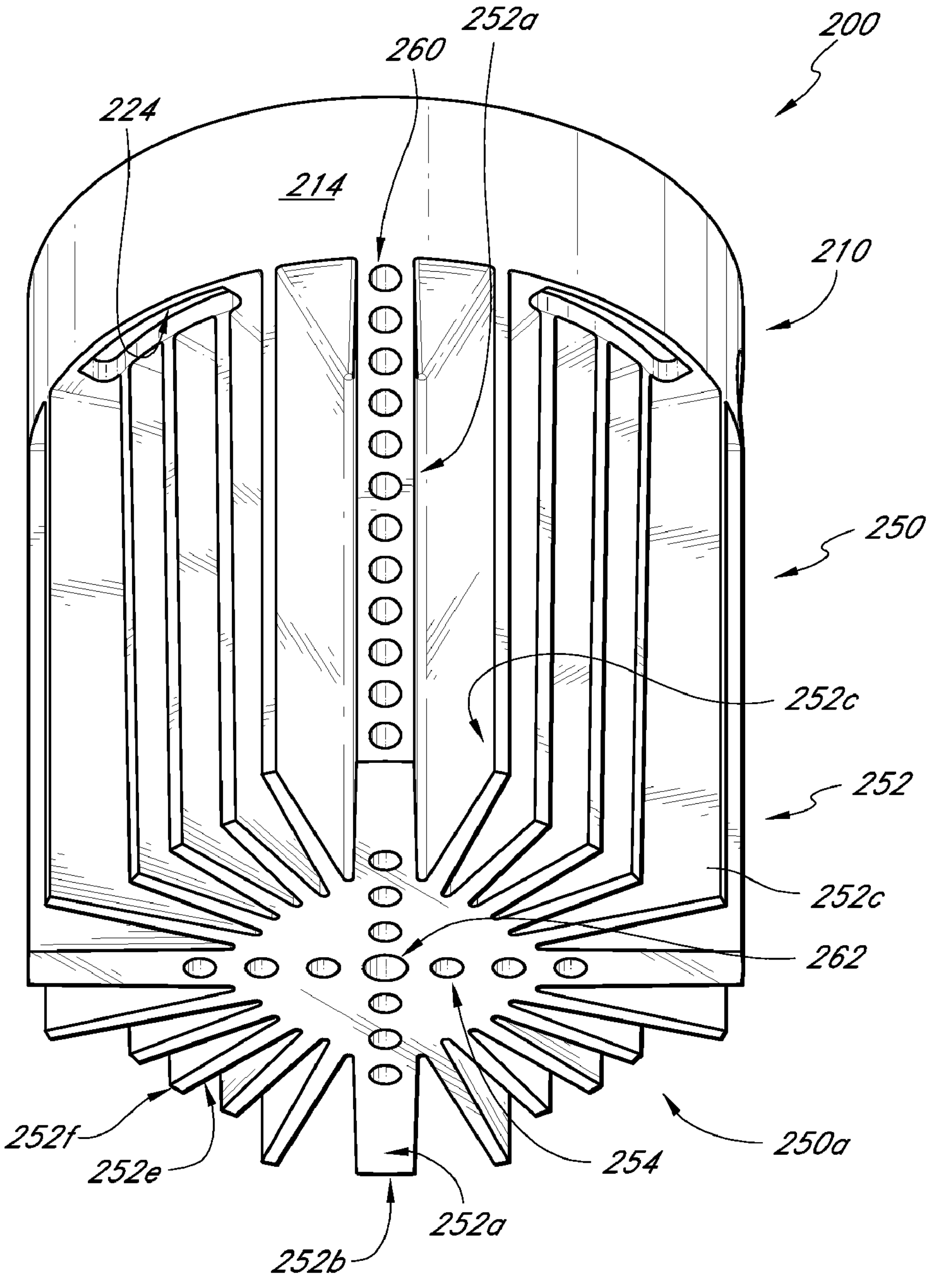
FIG. 10 is a perspective bottom view of the socket and heat sink unit in FIG. 9.
Figure 11:
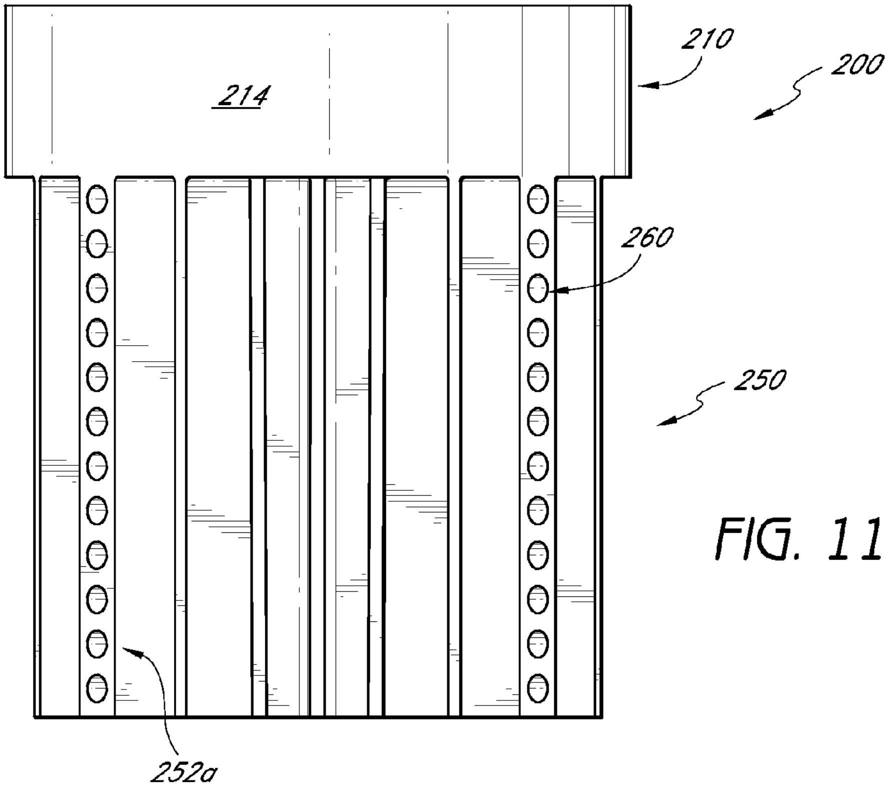
FIG. 11 is a side view of the socket and heat sink unit in FIG. 9.
Figure 12:
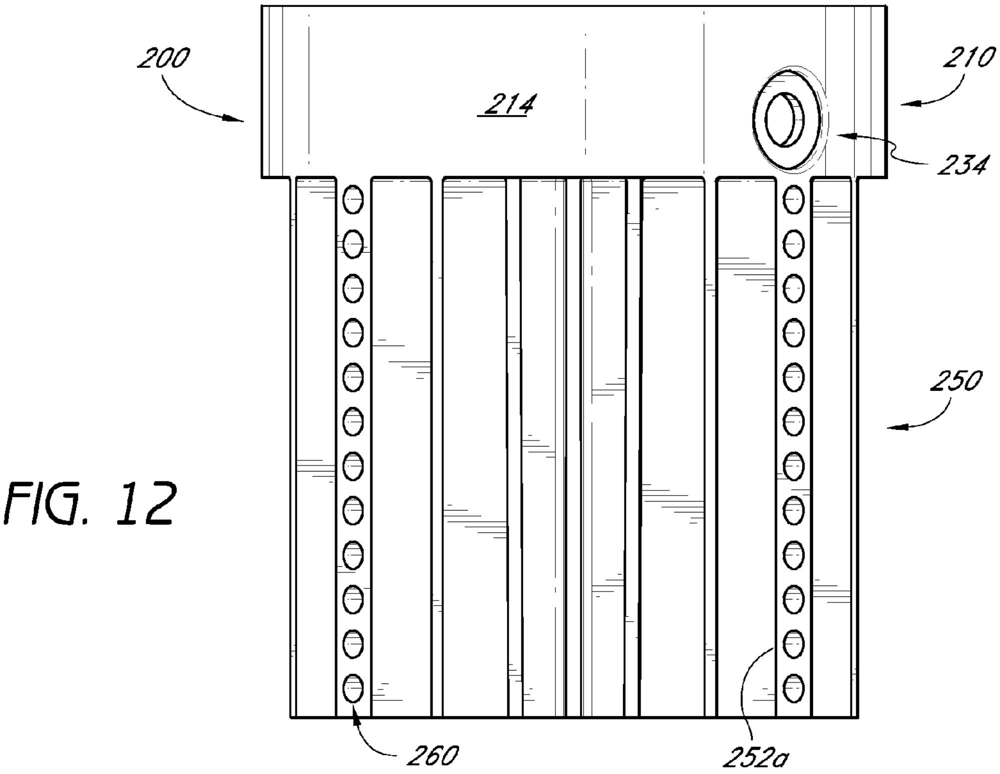
FIG. 12 is another side view of the socket and heat sink unit in FIG. 9, rotated 90 degrees from the view in FIG. 11.
Figure 13:
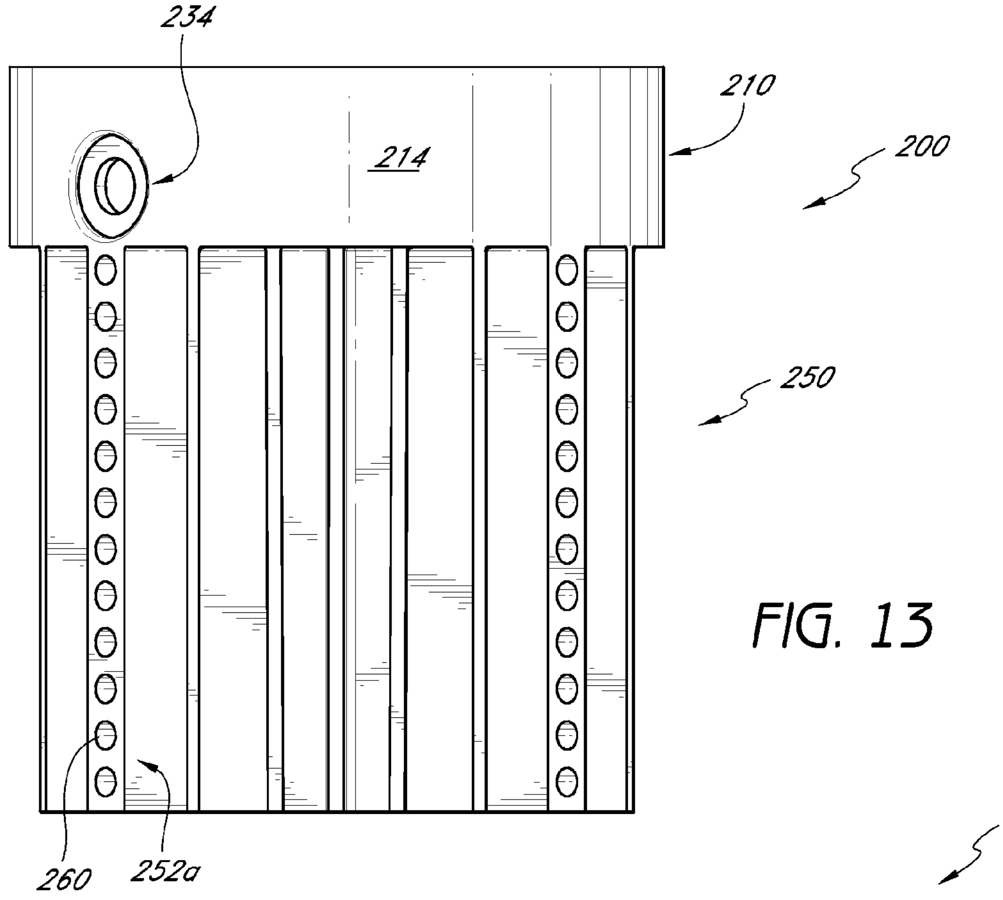
FIG. 13 is another side view of the socket and heat sink unit in FIG. 9, rotated 90 degrees from the view in FIG. 12.
Figure 14:
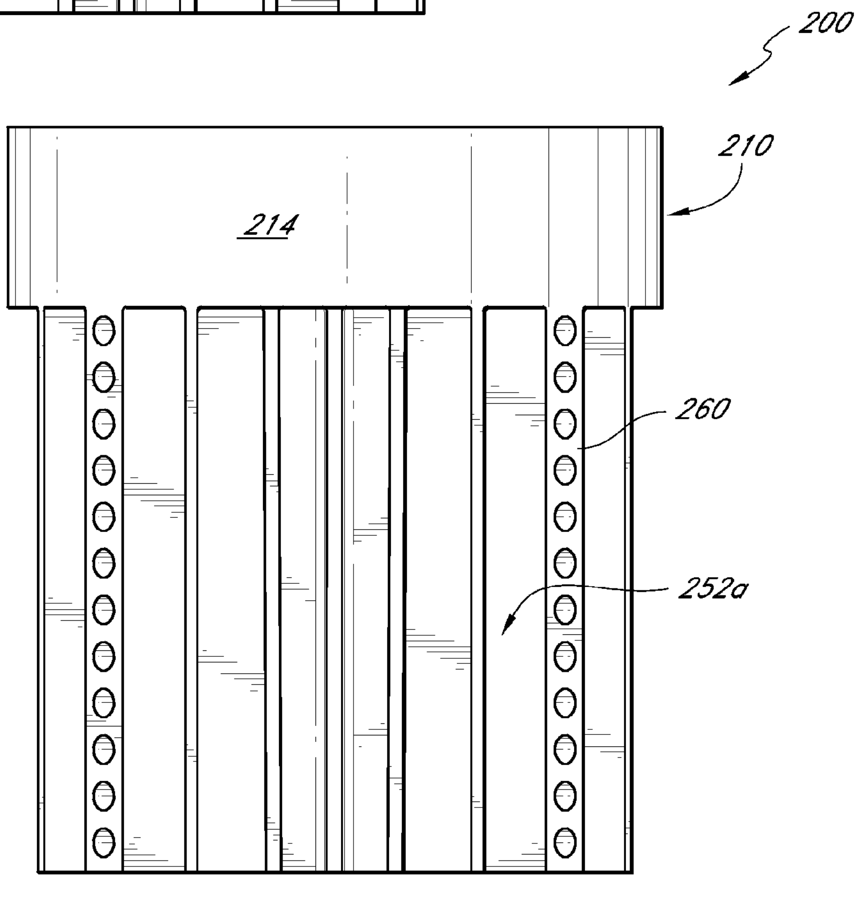
FIG. 14 is another side view of the socket and heat sink unit in FIG. 9, rotated 90 degrees from the view in FIG. 13.

With continued reference to FIG. 9, the socket portion 210 can have a base 222, which in one embodiment can define a recessed cavity with the wall 212. The base 222 can include one or more openings 224 along a boundary between the base 222 and the wall 212. The openings 224 can correspond to the recess portions 218, where each opening 224 has a circumferential width that generally corresponds to the circumferential width of the horizontal portion 218*b* of the recess 218. In one embodiment, the radial width of the opening 224 can be equal to or greater than the radial width of the recess portion 218.

Figure 15:
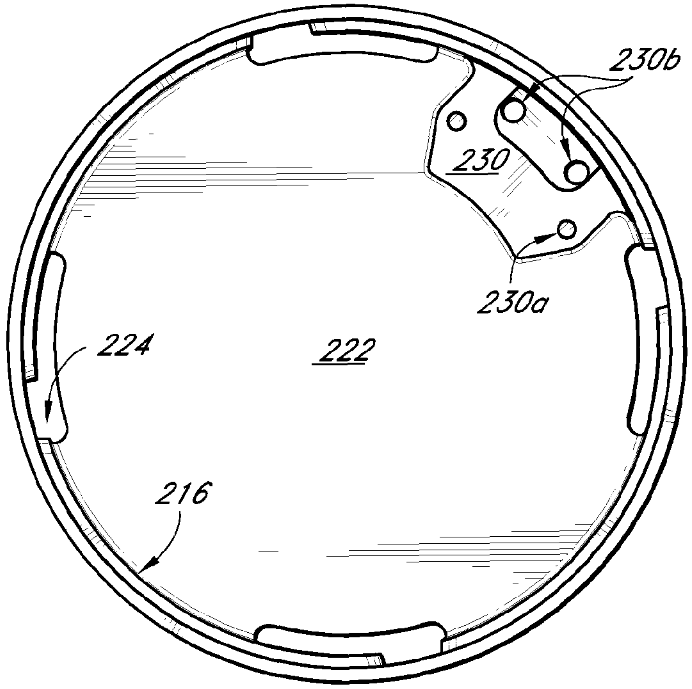
FIG. 15 is a top view of the socket and heat sink unit in FIG. 9.

As shown in FIGS. 9 and 15, the base 222 of the socket 210 can include a raised portion 230 to which a terminal block, as described above, can be fastened. For example, the terminal block can be attached to the raised portion 230 with one or more fasteners (e.g., screws, bolts, pins) inserted through holes 230*a* in the raised portion 230. Additionally, one or more apertures 230*b* can be formed through the base 222 between the raised portion 230 and the wall 212 through which an electrical cord for the terminal block can extend. The wall 212 can also include one or more apertures 234 formed therethrough and in another embodiment the electrical cord for the terminal block can extend through the aperture 234.

With reference to FIGS. 9-14 and 16, the heat sink 250 can include a plurality of plate like fins 252 extending radially outward from a central potion 254. The plate like fins 252 can include one or more primary fins 252*a* that extend radially outward from the central portion 254 to an outer edge 252*b*. In one embodiment, the outer edge 252*b* can be a distance from the X axis generally equal to the radius of the outer surface 214 of the wall 212. In the illustrated embodiment, the heat sink 250 has four primary fins 252*a*. However, the heat sink 250 can have more or fewer primary fins 252*a*. In one embodiment, the primary fin 252*a* can have one or more bores 260 formed on the outer edge 252*b* and extending generally horizontal toward the central portion 254.

Figure 16:
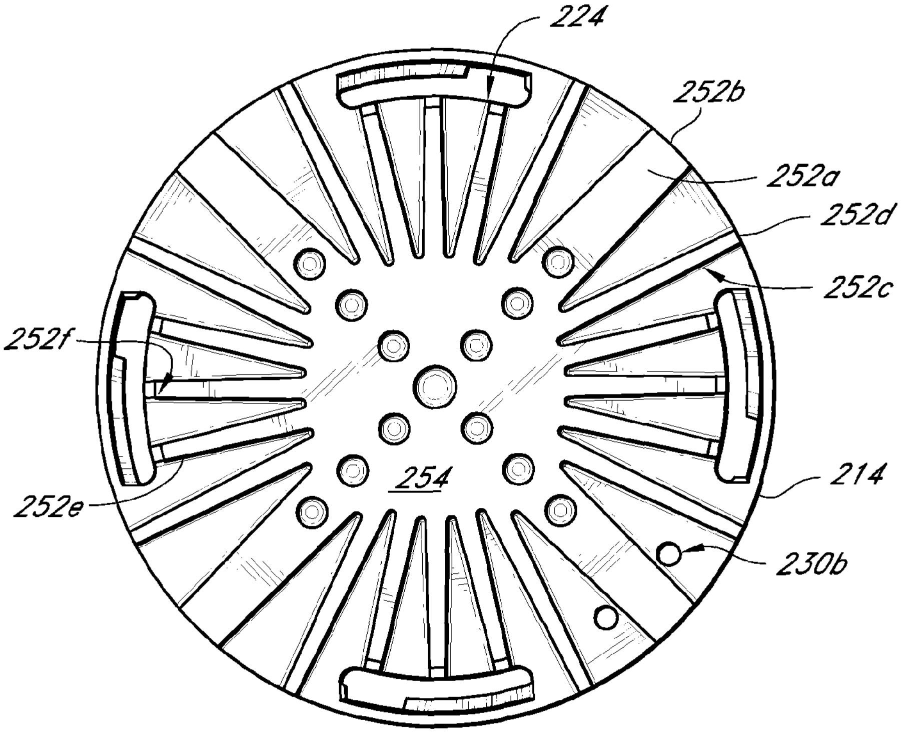
FIG. 16 is a bottom view of the socket and heat sink unit in FIG. 9.

The plate-like fins 252 can also include one or more secondary fins 252*c*. In the illustrated embodiment, as best shown in FIG. 16, the heat sink 250 has eight secondary fins 252*c*, with a secondary fin 252*c* disposed on either side of the primary fin 252*a*. Preferably, the secondary fin 252*c* has an outer edge 252*d* generally axially aligned with the outer surface 214 of the wall 212 of the socket portion 210. However, the heat sink 250 can have more or fewer secondary fins 252*c*.

The plate-like fins 252 can also include one or more short fins 252*e*. In the illustrated embodiment, as best shown in FIG. 16, the heat sink 150 has twelve short fins 252*e*, with three short fins 252*e* disposed between each pair of primary fins 252*a*. However, the heat sink 250 can have more or fewer short fins 252*e*. Preferably, the short fins 252*e* have an outer edge 252*f* aligned with an inner edge of the openings 224 so that the short fins 252*e* do not obstruct the openings. Therefore, in the illustrated embodiment, the fins 252 of the heat sink 250 define four generally identical quadrants about the X axis, as best shown in FIG. 16.

In one embodiment, the short fins 252*e* are spaced apart from each other by an equal amount. In another embodiment, at least two adjacent short fins 252*e* are closer to each other than to other adjacent short fins 252*e*. In one embodiment, the spacing between the short fins 252*e* and the secondary fins 252*c* is generally the same as the spacing between adjacent short fins 252*e*. In another embodiment, the spacing between the short fins 252*e* and the secondary fins 252*c* is different (e.g., larger or smaller) than the spacing between adjacent short fins 252*e*. In still another embodiment, the spacing between the primary fin 252*a* and the secondary fin 252*c* is generally the same as the spacing between the secondary fin 252*c* and an adjacent short fin 252*e*. In other embodiments, the spacing between the primary fin 252*a* and the secondary fin 252*c* can be different (e.g., larger or smaller) than the spacing between the secondary fin 252*c* and an adjacent short fin 252*e*. In still another embodiment, the primary fins 252*a*, secondary fins 252*b* and short fins 252*e* can be equally spaced apart about the circumference of the heat sink 250. In another embodiment, the fins 252 can have a curved or arcuate shape, such that when viewed from the end, as in FIG. 16, the fins 252 define a spiral shape, with some fins 252*a* being longer and some fins 252*e* being shorter. As discussed further below, the outer edge of the short fins 252*e* can correspond to the edge of the openings 224 and can, in one embodiment, be formed by slides used in conjunction with a die in a die-casting process. In one embodiment, the central portion 254 can have a circular cross-sectional shape, rather than the generally square shape shown in FIG. 16. However, the central portion 254 can have other suitable shapes.

In one embodiment, one or more bores 262 can be formed on the distal end 250*b* of the heat sink 250, that extend generally axially or parallel to the X axis. Advantageously, the bores 260, 262 allow the socket and heat sink unit 200 to be fastened to, for example, a housing of a light assembly in a variety of orientations, therefore increasing the versatility of the socket and heat sink unit 200.

As with the unit 100, the unit 200 can be made from any suitable material configured to conduct heat in an amount suitable for the removal of heat from the removable LED light module. In one embodiment, the unit 200 can be made of metal (e.g., aluminum or zinc) or metal alloy. In another embodiment, the unit 200 can be made of a heat conductive plastic. Additionally, the unit 200 can be injection molded or machined using processes known in the art. Preferably, as discussed above in connection with the embodiment of FIGS. 1-8, a die-casting process can be used to manufacture the unit 200 from a single tool set. In particular, a die with two complementary halves can be used in conjunction with one or more slides positionable relative to the die so as to form the openings 224 in the socket 210, as well as the outer edges 252*f* of the short fins 252*e*. Accordingly, the slides facilitate the formation of the quadrants of the heat sink 250 described above. As noted above, the die-casting process provides an efficient method of manufacturing the socket and heat sink unit 200 without additional machining, thus resulting in reduced time and cost for manufacturing the unit 200. Additionally, as discussed above, die casting advantageously allows the socket 210 to function as a heat dissipating member, with the wall 212 and base 222 of the socket 210 dissipating heat from the LED light module when the module is coupled to the socket 210.

Of course, the foregoing description is that of certain features, aspects and advantages of the present invention, to which various changes and modifications can be made without departing from the spirit and scope of the present invention. Moreover, the socket and heat sink unit need not feature all of the objects, advantages, features and aspects discussed above. Thus, for example, those of skill in the art will recognize that the invention can be embodied or carried out in a manner that achieves or optimizes one advantage or a group of advantages as taught herein without necessarily achieving other objects or advantages as may be taught or suggested herein. In addition, while a number of variations of the invention have been shown and described in detail, other modifications and methods of use, which are within the scope of this invention, will be readily apparent to those of skill in the art based upon this disclosure. It is contemplated that various combinations or subcombinations of these specific features and aspects of embodiments may be made and still fall within the scope of the invention. Accordingly, it should be understood that various features and aspects of the disclosed embodiments can be combined with or substituted for one another in order to form varying modes of the discussed socket and heat sink unit.

What is claimed is:

1. A socket and heat sink unit configured to couple to a removable LED light module, comprising:

a socket portion having one or more openings formed in a base thereof and one or more ramps aligned with said openings; and a heat sink portion attached to the socket portion and extending about a longitudinal central axis of the heat sink, the heat sink portion comprising a plurality of fins defining channels aligned with said openings in the socket, wherein the socket and heat sink portions are monolithic, and wherein the socket and heat sink can be formed in a die casting process comprising a die and cooperating slides, said slides positionable relative to the die to form the channels, openings and one or more edges of said ramps, the slides removable from the die when the die casting process is complete.

2. The unit of claim 1, wherein the fins are defined by plate-like members axially aligned about the central axis so that the plate-like members extend generally perpendicular to the central axis.

3. The unit of claim 1, wherein the fins extend radially outward from a central portion of the heat sink portion, each of the fins extending axially from the socket portion to a distal end of the heat sink portion.

4. The unit of claim 1, further comprising one or more apertures are disposed on one or more of the fins and extend generally perpendicular to the central axis, the apertures configured to removably receive a fastener therein.

5. The unit of claim 1, further comprising one or more apertures disposed on a distal face of the heat sink unit and extend generally parallel to the central axis, the apertures configured to removably receive a fastener therein.

6. The unit of claim 1, further comprising an aperture in a wall of the socket portion.

7. The unit of claim 6, further comprising an aperture in the base of the socket between a raised portion of the base and the wall of the socket.

8. A method of manufacturing a socket and heat sink unit, comprising:

providing a die having one or more complementary portions, said die having a shape complementary to the socket and heat sink unit;

positioning one or more slides in a desired position relative to the die; and injecting molten metal under pressure into the die to die cast the socket and heat sink unit, the socket portion having one or more openings formed in a base thereof and one or more ramps aligned with said openings, the heat sink portion attached to the socket portion and extending about a central longitudinal axis of the heat sink, the heat sink portion comprising a plurality of fins defining channels aligned with said openings in the socket, wherein the slides are positionable relative to the die to form the channels, openings and one or more edges of said ramps, the slides removable from the die when the die is detached from the socket and heat sink unit.

9. The method of claim 8, wherein the die has five complementary portions.

10. The method of claim 8, further comprising withdrawing the slides from the die before disassembling the die.

11. The method of claim 8, wherein the slides comprise a proximal portion having a contour that defines the one or more edges of said ramps.

12. The method of claim 8, wherein the slides are configured to extend through said openings in the base of the socket portion.

* * * * *